US011515467B2

(12) United States Patent
Van Der Wiel et al.

(10) Patent No.: US 11,515,467 B2
(45) Date of Patent: Nov. 29, 2022

(54) SEMICONDUCTOR STRESS SENSOR

(71) Applicant: Melexis Technologies NV, Tessenderlo (BE)

(72) Inventors: Appolonius Jacobus Van Der Wiel, Tessenderlo (BE); Maliheh Ramezani, Tessenderlo (BE); Cathleen Rooman, Tessenderlo (BE); Laurent Otte, Tessenderlo (BE); Johan Vergauwen, Tessenderlo (BE)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 173 days.

(21) Appl. No.: 17/111,871

(22) Filed: Dec. 4, 2020

(65) Prior Publication Data

US 2021/0175410 A1 Jun. 10, 2021

(30) Foreign Application Priority Data

Dec. 6, 2019 (EP) .................................. 19214147

(51) Int. Cl.
*H01L 41/113* (2006.01)
*G01L 1/18* (2006.01)
(Continued)

(52) U.S. Cl.
CPC ............ *H01L 41/1132* (2013.01); *G01L 1/18* (2013.01); *H01L 41/0475* (2013.01); *H01L 41/053* (2013.01)

(58) Field of Classification Search
CPC ............. H01L 41/1132; H01L 41/0475; H01L 41/053; G01L 1/18
(Continued)

(56) References Cited

U.S. PATENT DOCUMENTS 9,557,237 B2  1/2017  McNeal et al.
9,790,085 B1  10/2017 Bilic et al.
(Continued)

FOREIGN PATENT DOCUMENTS

JP 2011102775 A 5/2011

OTHER PUBLICATIONS

Search Report from corresponding EP Application No. EP19214147.1 dated Jun. 9, 2020.
(Continued)

*Primary Examiner* — David Vu
*Assistant Examiner* — Brandon C Fox
(74) *Attorney, Agent, or Firm* — Workman Nydegger

(57) ABSTRACT

A piezo-resistor sensor includes a diffusion of a first conductivity type in a well of an opposite second type, contacts with islands in the diffusion, interconnects with the contacts, and a shield covers the diffusion between the contacts and extends over side walls of the diffusion between the contacts. Each interconnect covers the diffusion at the corresponding contact and extends over edges of the diffusion, and each island is at a side covered by its interconnect. A guard ring of the second type is around the diffusion. The shield covers the well between the diffusion and the ring and the edge of the ring facing the diffusion. If a gap between the shield and the interconnect is present, the ring bridges this gap, and/or the edges of the diffusion are completely covered by the combination of the shield and the interconnects.

13 Claims, 10 Drawing Sheets

(51) Int. Cl.
*H01L 41/047* (2006.01)
*H01L 41/053* (2006.01)

(58) Field of Classification Search
USPC .......................................................... 257/418
See application file for complete search history.

(56) References Cited

U.S. PATENT DOCUMENTS

| | | | |
|---|---|---|---|
| 2002/0078755 | A1 | 6/2002 | Imai et al. |
| 2007/0254387 | A1 | 11/2007 | Hakomori et al. |
| 2015/0008544 | A1 | 1/2015 | Yazawa et al. |
| 2018/0266901 | A1* | 9/2018 | Tanaka .................... G01L 1/183 |
| 2018/0282148 | A1* | 10/2018 | Hayashi ................ B81B 3/0072 |
| 2020/0158677 | A1* | 5/2020 | Nakane ................ G01N 27/223 |

OTHER PUBLICATIONS

Office Action from corresponding European Application No. 19214147.1, dated Jul. 25, 2022.

* cited by examiner

SEMICONDUCTOR STRESS SENSOR

FIELD OF THE INVENTION

The invention relates to the field of semiconductor stress sensing elements. More specifically it relates to piezo-resistor based stress sensors.

BACKGROUND OF THE INVENTION

A semiconductor stress sensing element comprises a diffusion path of a first conductivity type defined in a lowly doped well of a second, opposite conductivity type. The sections of the diffusion path that have to be stress sensitive are lowly doped and other sections that should not be stress sensitive are highly doped or even consist of a metal-silicon alloy. The sheet resistance of the diffusion path is inversely proportional on the level of doping. The sheet resistance of a lowly doped diffusion path is typically between 300 and 5000 ohm/square, whereas the sheet resistance of a high doped area is typically between 20 and 150 ohm/square. When an alloy is formed at the surface of a highly doped area, the sheet resistance even drops to only 1 to 5 ohm/square. Typically highly doped or metal-silicon alloy sections are placed between the stress sensitive lowly doped parts and interconnect to avoid stress modulation generated by the interconnect.

Such semiconductor stress sensing elements are modulated by external electrical fields which are often created by surface charges.

A first way of modulation is that surface charge directly above the low doped diffusion path modulates the low doped sections of the diffusion path.

A second way of modulation is that charge above the well next to the entire diffusion path can create enough inversion at the well surface to provide a leakage from one point of the diffusion path with a higher voltage to another point of the diffusion path with a lower voltage or even to another diffusion path of another resistor.

A first way of applying a conductive shield that not only prevents modulation of the piezo-resistor but also prevents leakage due to inversion next to the piezo-resistor is to cover the entire piezo-resistor with metal (including the contacts to interconnect). This is used in the patent publication U.S. Pat. No. 9,557,237B2.

This solution has, however, as drawback that a second metallic shield layer has to be placed over the interconnect to cover it. This involves extra processing effort. Another disadvantage is that the piezo resistors get further away from the surface leading to a significant loss of sensitivity.

Another way, elaborated on in US20150008544A1, is to use a shallow diffusion of opposite conductivity type covering all piezo resistors. In that case the doping is limited to avoid inversion of the shallow shield diffusion as otherwise breakdown between the piezo resistor and the shield will take place. Therefore this solution will fail for very high charging of the surface. Another issue is that the gap between the shield and highly doped p-diffusions still can provide a path for leakage currents to other structures.

In some prior art sensors shield metal is provided along the interconnect path to avoid the need for a second metal layer. An example thereof is illustrated in U.S. Pat. No. 9,790,085. In that case, however, metal is disposed over the membrane which will lead to drift due to plastic deformation of this metal and again inversion can take place between the metal lines which still provide a path for leaking from one resistor to another resistor.

There is therefore a need for shielded semiconductor stress sensors to avoid leakage currents.

SUMMARY OF THE INVENTION

It is an object of embodiments of the present invention to provide a good piezo-resistor based sensor.

The above objective is accomplished by a method and device according to the present invention.

Embodiments of the present invention relate to a piezo-resistor based sensor. The sensor comprises at least one sensing element partly or completely provided on a flexible structure. The sensing element comprises:
  at least one piezo-diffusion region of a first conductivity type in a well of a second conductivity type different from the first conductivity type,
  two or more contacts in electrical contact with islands in the piezo-diffusion region, the piezo-diffusion region extending between the two or more contacts, wherein the islands have a higher doping of the first conductivity type than the doping of the piezo-diffusion region,
  a conductive interconnect structure per contact for electrically biasing the piezo-diffusion region through the contacts.

The sensing element, moreover, comprising a conductive shield which is covering the piezo-diffusion region between the contacts and extends over side walls of the piezo-diffusion region between the contacts.

Each conductive interconnect structure is covering the piezo-diffusion region at the corresponding contact and extends over edges of the piezo-diffusion region at the corresponding contact.

Each island is at one side covered by its corresponding conductive interconnect structure, In embodiments of the present invention the sensing element comprises a guard ring of the second conductivity type around the piezo diffusion region with a distance between the guard ring and the piezo diffusion region. The conductive shield is covering the well between the piezo diffusion region and the guard ring, and the edge of the guard ring facing the piezo diffusion region and wherein. If a gap is present between the conductive shield and the interconnect structure, the guard ring bridges this gap.

The guard ring is not necessarily required. In alternative embodiments of the present invention the edges of the piezo-diffusion region are completely covered by the combination of the conductive shield and the interconnect structures.

It is an advantage of embodiments of the present invention that leakage currents which might occur between neighboring piezo-diffusion regions, which are caused by inversion of the bulk between these piezo-diffusion regions can be prevented.

This is achieved by providing the electrical contacts in contact with highly doped islands in the piezo-diffusion region, wherein the sensor, moreover, has a guard ring extending from under the conductive shield and under the interconnect wherein, if a gap is present between the shield and the interconnect, the ring bridges this gap, or wherein the edges of the piezo-diffusion region between the interconnect structures are completely covered by the shield.

It is an advantage of embodiments of the present invention that modulation caused by a charge above the well region next to a piezo-diffusion region which creates enough inversion at the well surface to provide a leakage from one point of the diffusion path with higher voltage to another point of the diffusion path with lower voltage or even to another diffusion path of another resistor, which would arise without the presence of a guard ring can be reduced by providing the guard ring which prevents the inversion.

The shield region may be formed in the flexible structure or may be above it.

In embodiments of the present invention wherein the distance between the guard ring and the piezo-diffusion region is smaller than 5 µm.

In embodiments of the present invention the distance may even be smaller than 2 µm. In embodiments of the present invention the distance between the guard ring and the piezo diffusion is preferably as small as possible but large enough to prevent breakdown. In embodiments of the present invention this distance may for example range between 1 and 5 µm.

In embodiments of the present invention the conductive shield is electrically connected to the guard ring.

Leaving the shield floating will allow it to charge and then cause leakage or resistor modulation. Therefore it needs to contact a stable voltage. The guard ring by definition always has the substrate voltage and is low ohmic, so it is a very stable voltage which is always present. It minimizes the interconnect for the shield. In case of an n+ shield no contacts are required. Such a shield can only be at the same voltage as the well or guard ring.

In embodiments of the present invention the conductive shield consists of the same material as the conductive interconnect structures, and the conductive shield is isolated from the conductive interconnect structures.

It is an advantage of embodiments of the present invention that the conductive shield and the conductive interconnect structures can be made of the same material and can be obtained using the same process steps.

In embodiments of the present invention the conductive shield is separated from the conductive interconnect structures by a gap of at least 10 µm.

In embodiments of the present invention the gap may be more than 20 µm, or even be more than 50 µm.

In embodiments of the present invention each island stretches from its corresponding conductive interconnect structure to the conductive shield such that at least part of it is covered by the conductive shield.

It is an advantage of embodiments of the present invention that modulation of the piezo-diffusion can be reduced by adding the highly doped islands which are extending such that they are covered by the conductive interconnect structure on one side and by the conductive shield on another side.

In embodiments of the present invention the conductive interconnect structures cover part of the well between the guard ring and the piezo-diffusion region.

As an isolation must be present between the interconnect structures, the interconnect structure cannot be covering the complete well. In embodiments of the present invention the interconnect structures are covering the well outside the flexible structure. This flexible structure may for example be a membrane, wherein the membrane is a part of the sensor with reduced thickness to enable stress measurements.

It is advantageous that the interconnect, which may for example be a metal, is not present on the membrane as this may lead to drift due to plastic deformation of the metal.

In embodiments of the present invention that the piezo-diffusion region has approximately the same potential as the conductive interconnect structure.

In embodiments of the present invention the conductive shield consists of a material which is different from the material of the conductive interconnect structures.

In embodiments of the present invention the conductive shield covers the piezo-diffusion region except for the islands.

In embodiments of the present invention the conductive shield covers the piezo-diffusion region except for the islands and a spacing around the islands.

For example for n-shield, poly-silicon CMOS it is required that the spacing around the islands is also not covered by the shield.

In embodiments of the present invention the conductive shield covers the entire well between the piezo-diffusion region, and covers the edge of the guard ring facing the piezo-diffusion region.

In embodiments of the present invention the conductive shield comprises a shallow diffusion of the second conductivity type.

In embodiments of the present invention the conductive shield is made of polysilicon.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
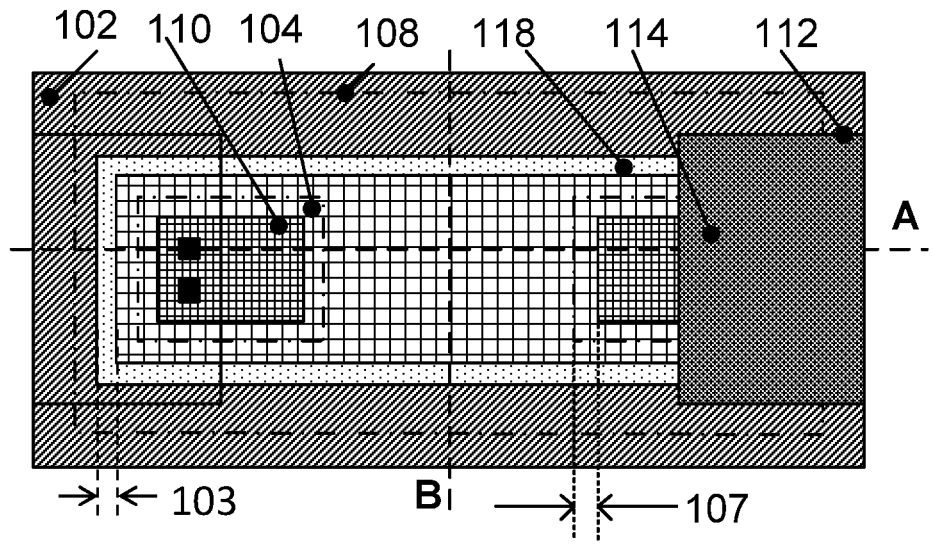
FIG. 1 shows the top view of a piezo-resistor based sensor comprising an n-type conductive shield in accordance with embodiments of the present invention.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to a well of a second conductivity type reference is made to a well or bulk of the opposite doping as the doping of the piezo-diffusion region. The well may for example be a p-type well in a n-type substrate, or it may for example be a p-type substrate wherein n-type piezo-diffusion regions are present in the p-type substrate.

In the introduction different ways of modulation are cited. The first way of modulation can be suppressed completely by providing a conductive shield above the low doped sections of the diffusion path.

The second way of modulation can only be totally suppressed by providing a conductive shield covering all edges of the entire diffusion path.

A third way of modulation is that charge above the well next to the diffusion path can cause inversion and allow holes to flow from the diffusion path into the well and then recombine and causing a leakage current to the substrate. This effect is small as it depends on a difference in concentration of holes in the piezo diffusion and the inversion layer. For very strong inversion holes could even flow from the well into the diffusion.

A conductive shield should be provided which covers the entire diffusion path and all its edges which:

a) does not electrically connect to the interconnect of the sensor but to the substrate, b) does not decrease the sensitivity by adding additional layers above the sensor membrane, c) does not cause long term drift by changing its internal stress over time (e.g. metal creep, plastic deformation).

Embodiments of the present invention relate to a piezo-resistor based sensor. Schematic drawings of piezo-resistor based sensors according to embodiments of the present invention are illustrated in FIGS. 1 to 12. The reference numbers in the description are referring to the reference numbers in these figures. The sensor 100 comprises at least one sensing element provided on a flexible structure. The sensing element comprises:

at least one piezo-diffusion region 104 of a first conductivity type in a well 118 of a second conductivity type different from the first conductivity type;

two or more contacts 114 in electrical contact with islands 110 in the piezo-diffusion region, the piezo-diffusion region 104 extending between the two or more contacts 114, and the islands 110 having a higher doping of the first conductivity type than the doping of the piezo-diffusion region 104; there are at least two islands 110 and there is at least one contact 114 per island;

a conductive interconnect structure 112 per contact 114 for electrically biasing the piezo-diffusion region 104 through the contacts 114, a conductive shield 108, 208, 308 which is covering the piezo-diffusion region 104 between the contacts 114 and extends over side walls of the piezo-diffusion region 104 between the contacts 114 and each conductive interconnect structure 112 is covering the piezo-diffusion region 104 at the corresponding contact and extends over edges of the piezo-diffusion region 104 at the corresponding contact and each island 110 is at one side covered by its corresponding conductive interconnect structure 112.

In embodiments of the present invention the sensing element, moreover, comprises a guard ring 102 of the second conductivity type around the piezo diffusion region 104 with a distance 103 between the guard ring 102 and the piezo diffusion region 104, wherein the conductive shield 108, 208, 308 is covering the well between the piezo diffusion region 104 and the guard ring 102, and the edge of the guard ring 102 facing the piezo diffusion region 104 and wherein, if a gap is present between the conductive shield 108, 208, 308 and the interconnect structure 112, the guard ring 102 bridges this gap. This is particularly advantageous when the conductive shield 208 and the interconnect structure 112 are made of the same conductive layer. In that case a gap is required between the conductive shield and the interconnect structure. In embodiments of the present invention the guard ring is present where the conductive shield and the interconnect structure do not overlap. The distance between the guard ring 102 and the piezo diffusion region 104 is not necessarily constant. It may vary along the edge of the piezo diffusion.

In alternative embodiments of the present invention the edges of the piezo-diffusion region 104 are completely covered by the combination of the conductive shield 108, 308 and the interconnect structures 112. This is particularly advantageous when the conductive shield 108, 308 and the interconnect structure 112 are made of a different conductive layer. The conductive shield is in that case extended such that no edge of the piezo-diffusion region 104 is uncovered. In these embodiments the guard ring is not essential. In case the interconnect structure is made with a different layer than the conductive shield, the interconnect structure can overlap with the conductive shield. In that case there is no gap which necessarily needs to be bridged by a guard ring.

In both cases (the case of the guard ring, and the case of the compete coverage) leakage currents between piezoresistive areas are prevented by preventing inversion of the bulk.

Piezo-based sensors, according to embodiments of the present invention, are comprising the diffusion path 104 of a first conductivity type on a well 118 of a second conductivity type, wherein the diffusion path comprises highly doped islands 110 of the first conductivity type and low doped regions for stress sensing. The diffusion path is located in a lower doped well/bulk 118 of opposite doping.

The islands have a higher doping of the first conductivity type than the doping of the piezo-diffusion region. In embodiments of the present invention silicide may be implemented in the highly doped islands to decrease the sheet resistance. In embodiments of the present invention the doping level of the islands is such that it provides a sheet resistance lower than 150 ohms/square or even lower than 5 ohms/square in combination with a silicide metal doping whereas the doping level of the piezoresistive part of the piezo-diffusion preferably provides a sheet resistance which is higher than 300 ohms/square to obtain sufficient sensitivity.

In embodiments of the present invention the islands are formed inside the piezo-diffusion and their outer edge is separated by a minimal distance 109 from the edge of the piezo-diffusion (i.e. from the side wall of the piezo-diffusion). This distance typically ranges from 1 µm to 10 µm and should be sufficiently large such that an edge of a shield can be realized outside the island and still inside the piezo-diffusion. This distance typically ranges between 1 µm and 10 µm because at larger distances the capacitance and leakage currents will increase without increasing the sensitivity and at distances lower than 1 µm the breakdown voltage between piezo-diffusion and the bulk will decrease.

By providing the guard ring 102 of the second conductivity type that runs tightly around the diffusion path/piezo resistor 104, in addition to the shield structures, especially protection is provided from the second way of modulation by making the inversion in this ring 102 impossible. In embodiments of the present invention the proposed guard ring structure 102 introduces a solution that does not provide shielding, but makes the area immune for inversion. In embodiments of the present invention specific combinations of a guard ring and shield are made. When the well between the piezo diffusion region and the guard ring would not be covered, charge above this area or a perpendicular electric field can create charges in this well which can create parasitic currents parallel to the diffusion area and therefore modulating the resistance of the diffusion area. Shielding this area makes the resistors, therefore, more stable. The guard ring assures that the current has to stay within this area, but the current can still flow parallel to the guard ring between guard ring and piezo-diffusion causing to decrease the actual piezoresistance.

In embodiments of the present invention the guard ring 102 is so highly doped or even provided with a silicon-metal alloy that no inversion in this layer can take place. Then inversion by surface charges that can provide a leaking path from the one piezo element to another will stop at this guard ring 102 and can only flow in the minimized space between guard ring and piezo diffusion.

As disclosed earlier the guard ring 102 is not essential in all embodiments of the present invention, but may provide additional protection. Therefore in the following description two situations are described in relation to 4 different embodiments relating to limitations of features available in the process for manufacturing.

In embodiments of the present invention typically more than 90% of the resistance is created by the lower doped sections of the diffusion path 104 (also referred to as piezo-diffusion region). Therefore the leakage currents parallel to the p++ sections are very small compared to the main current through the highly doped islands 110 (e.g. p++ sections) as the resistance of the islands 110 is typically 20 times lower than that of the diffusion path 104. Therefore, leakage currents in the areas with a length 106 and a width 116 can be neglected compared to the current in the adjacent highly doped island 110 (this may for example be a p++ section).

In some embodiments of the present invention the conductive shield 108 may be formed from a different layer as the conductive interconnect structures 112. In such embodiments the interconnect structures 112 may be provided as second conductive layer. They may for example be formed from a metal layer. They are located over the conductive shield which is provided as a first conductive layer. The interconnect structures 112 are used for at least a contact layer from/to the piezo diffusion layer 104. In such embodiments silicide may be implemented in highly doped islands 110 (e.g. p++ areas) inside the piezo-diffusion region 104, to decrease their resistance and therefore improve the performance of the sensor. In embodiments of the present invention the conductive shield may be formed such that it is not covering the silicide. In embodiments of the present invention, more specifically in those embodiments where the conductive shield 108 is not covering the islands 110, these islands are formed inside the piezo-diffusion such that they are separated from the side wall of the piezo-diffusion by a distance 109. In embodiments of the present invention the breakdown voltage is determined by the doping level of the diffusion (e.g. p diffusion) facing the bulk. Therefore the breakdown voltage defined by the piezo diffusion layer 104 can be maintained by providing islands with an increased doping level (e.g. p++ islands) in the diffusion region and keeping a distance 109 between the islands with increased doping level and the edge of the diffusion region. Without this distance the breakdown voltage will decrease significantly.

In embodiments of the present invention the outer edge of the piezo diffusion layer 104 is covered by the shield. It is noted that shielding the edge of the piezodiffusion or providing the islands (e.g. the p++ islands) with silicides does not change the breakdown voltage significantly.

In embodiments of the present invention the first conductivity type may be p-type and the second conductivity type may be n-type or vice versa.

In the following examples it is assumed that the first conductivity type is p-type and the second conductivity type is n-type. In that case the conductive shield may for example be an n-type conductive shield. Thus shielding with a p-n junction (n-shield) is obtained. An example thereof is given in FIGS. 1 to 3. A n-doped layer 108 covering the piezo diffusion 104 is the first conductive layer 108 providing the shielding function. In this example p++ areas with or without silicide are present inside the piezo diffusion and the outer edge of the piezo diffusion is covered by the shield. For the n-shield 108 there is a minimum distance to the p++ layer with silicide (the island 110) inside the piezo diffusion.

Optimal contact for the conductive shield 108 (in this example n-shield) is achieved when there is n++ diffusion around piezo diffusion path 104 with overlap of the conductive shield over the entire inner edge of the n++ diffusion. This is because the conductive shield 108 does not have a direct metal contact, but is electrically connected to the bulk and preferably to n++.

In this exemplary embodiment of the present invention the guard ring 102 improves the substrate contact to the 2nd conductive layer (the interconnect structures 112) but it is not mandatory.

Figure 2:
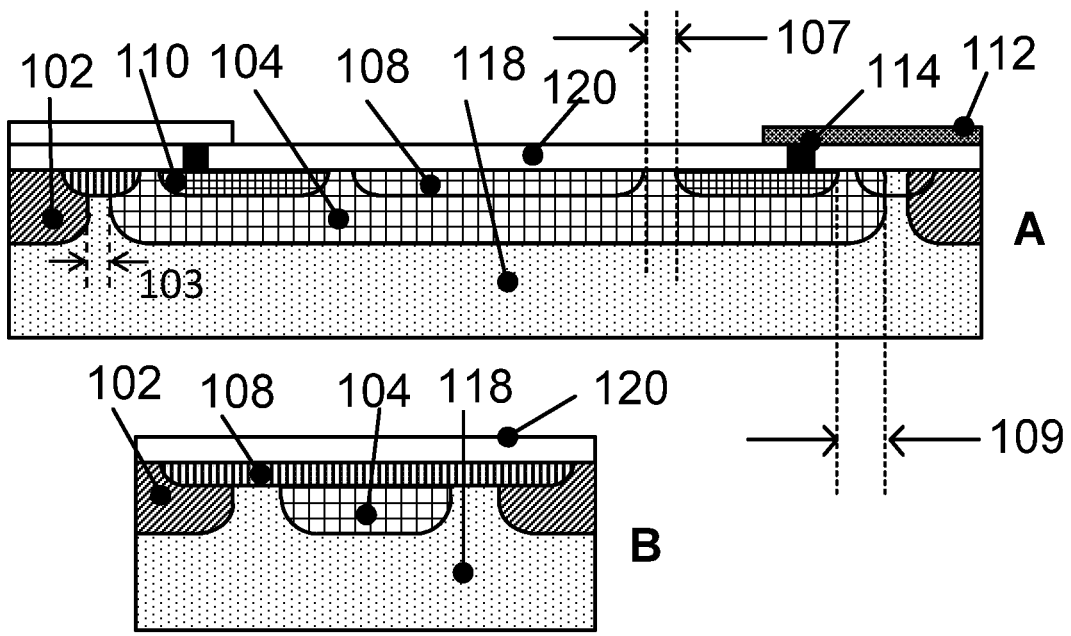
FIG. 2 shows cross-sections of a piezo-resistor based sensor comprising an n-type conductive shield in accordance with embodiments of the present invention.
Figure 3:
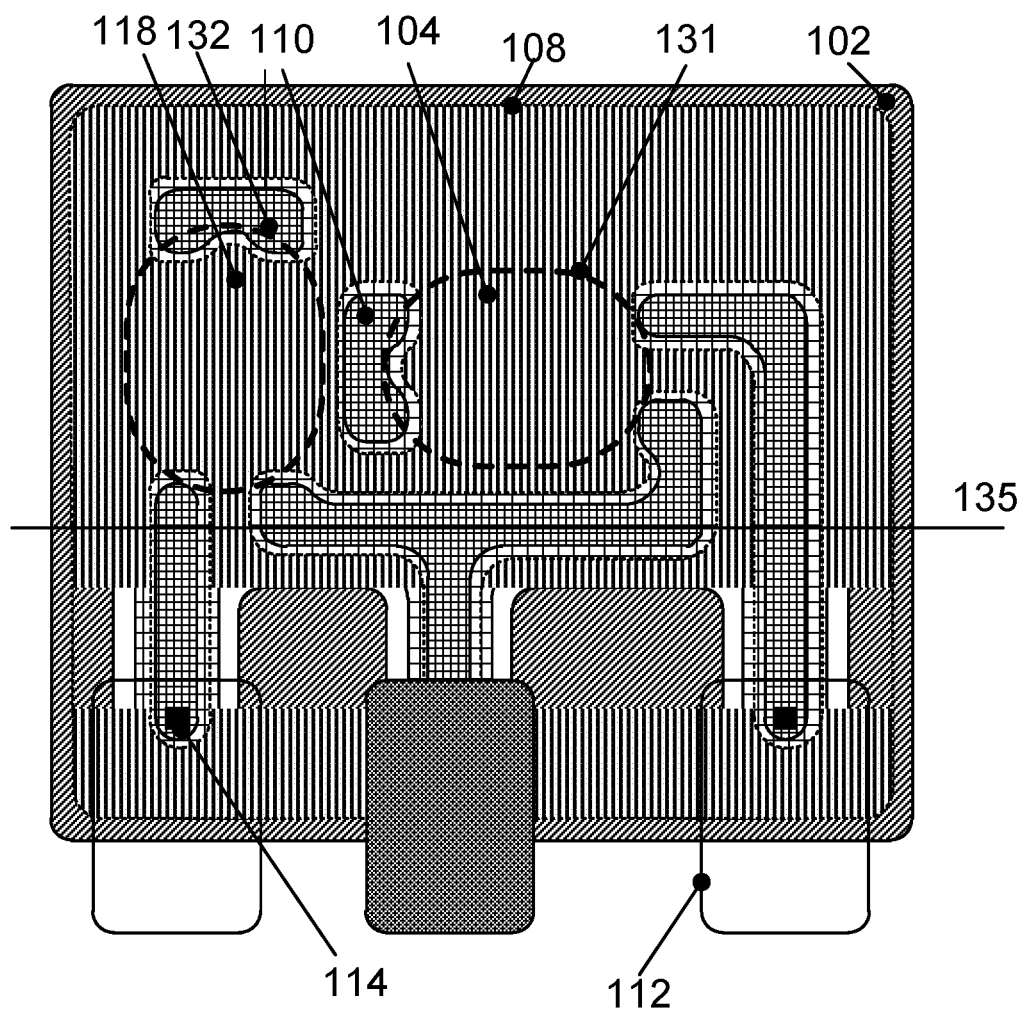
FIG. 3 shows the layout of a double resistor based sensor comprising an n-type conductive shield in accordance with embodiments of the present invention.

FIGS. 1 and 2 show schematic drawings of a piezo-resistor based sensor according to an exemplary embodiment of the present invention. In FIG. 1 the top view is shown. In FIG. 2A a longitudinal cross-section is shown. In FIG. 2B a lateral cross-section is shown. In this example the conductive shield 108 is a shallow diffusion of opposite conductivity type to the conductivity type of the diffusion path 104. In FIG. 1 for illustration purposes it is selected that the first conductivity type of the diffusion path is p-type and the second conductivity is therefore n-type. Since the conductive shield 108 is of the n-type, by extending it to overlap the guard ring 102 (n++), an ohmic connection is provided between the conductive shield 108 and the guard 102. Because the conductive shield 108 is constructed on the same silicon as the diffusion path 104, the dielectric layer 120 covers the conductive shield 108. FIG. 3 shows the layout of a double resistor with such an n-shield with a longitudinal resistor 132, a transversal resistor 131 and a membrane edge 135.

At places where no highly doped (e.g. p++ or p++ provided with a sintered silicon-metal alloy) area 110 is placed in the diffusion path 104, the diffusion path is covered with a shield 108 to prevent modulation by surface charges of the lowly doped section of the diffusion path 104 under the shield. Here the shield not only covers the diffusion path 104, but also the gap between the diffusion path 104 and the guard ring 102. Hence no currents can flow parallel to the diffusion path 104 between the diffusion path and the guard ring 102 where a shield is provided.

At places where islands 110 (p++ or p++ provided with a silicon-metal alloy) are placed in the diffusion path 104 the diffusion path can often not be covered by a shield for technology reasons. As a result currents can be modulated in the narrow area of the piezodiffusion between the island (e.g. p++ island) and the shield. But here these current modulations are in parallel with the current through the islands 110 (e.g. p++ or sintered p++). Since the ratio in sheet resistance between the islands 110 (p++ or sintered p++ areas) and that of the piezodiffusion 104 is very low and the gap between the shield 108 and the p++ island 110 is minimized (e.g. to between 1 and 5 µm), the influence of these currents can be neglected. In this example the conductive shield 108 is covering the piezo-diffusion region 104 except for the islands 110 and a spacing 107 around the islands.

At places where the metal interconnect 112 covers the contacts 114 to the islands 110 in the diffusion path 104 (p++ or p++ provided with a silicon-metal alloy) this metal has to cover not only the contacts, but also the diffusion path 104, the gap between the diffusion path 104 and at least partly the guard ring 102. Hence, at the contacts for the current through the diffusion path 104 the metal interconnect 112 serves as shield and is therefore bridging the gap between guard ring 102 and the diffusion path 104.

Figure 4:
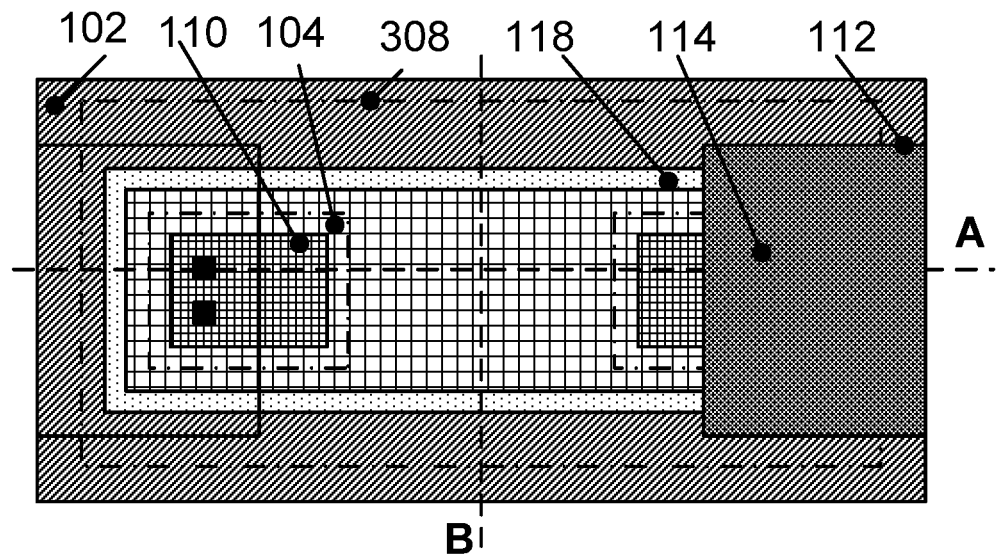
FIG. 4 shows the top view of a piezo-resistor based sensor comprising a CMOS poly shield in accordance with embodiments of the present invention.
Figure 5:
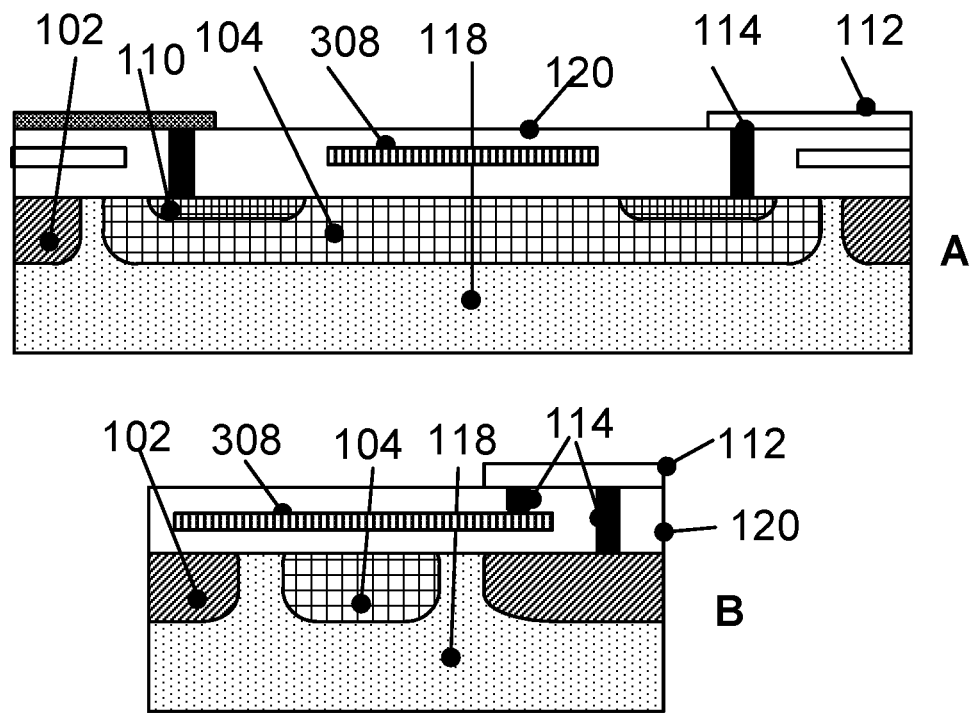
FIG. 5 shows cross-sections of a piezo-resistor based sensor comprising a CMOS poly shield in accordance with embodiments of the present invention.
Figure 6:
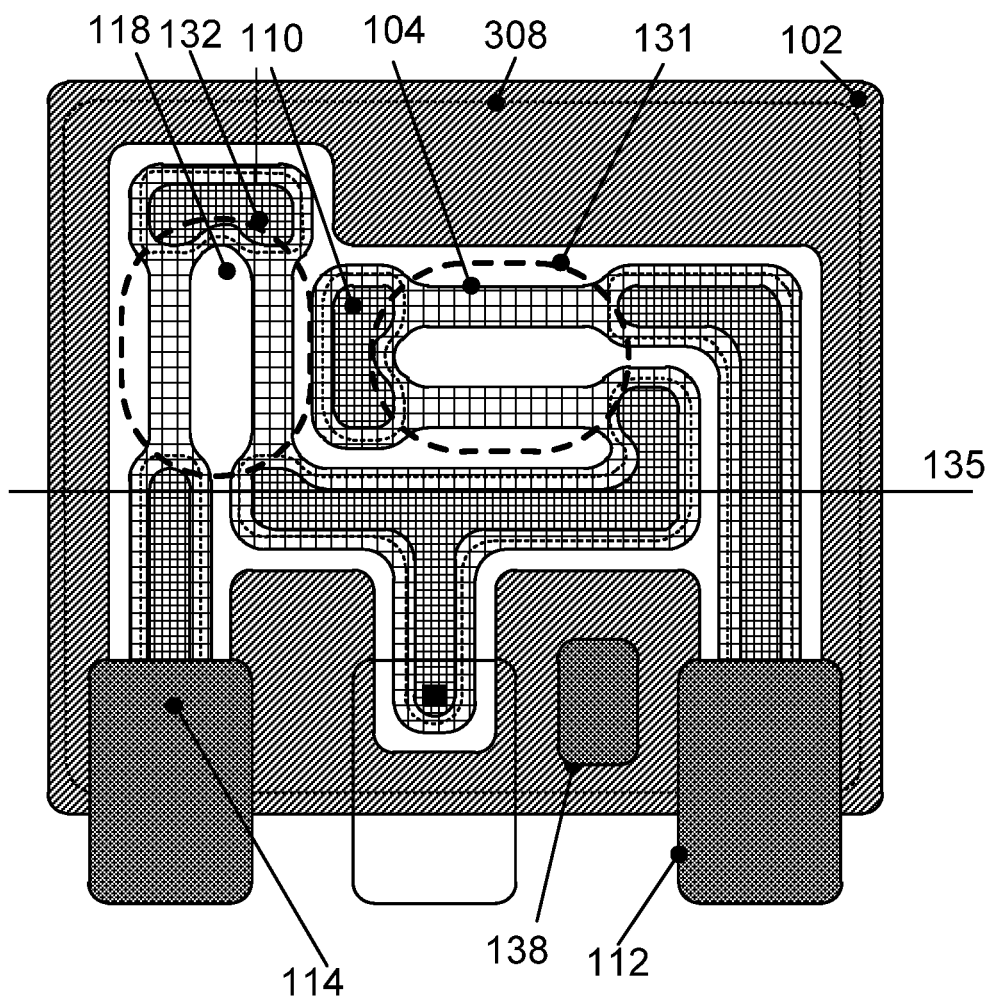
FIG. 6 shows the layout of a double resistor based sensor comprising a CMOS poly shield in accordance with embodiments of the present invention.

In embodiments of the present invention the piezo-diffusion 104 may have a typical depth of 0.3 until 1.5 µm whereas the islands 110 (e.g. p++ islands) typically may only have a depth between 0.1 and 0.7 µm. The islands 110 (e.g. p++ islands) need high doping at the top to make good ohmic contacts with the conductive interconnect structures 112 (e.g. metal) and therefore it is not necessary to provide high doping far away from the surface. Diffusion after implant is always much shorter than the diffusion for the piezo implant. Therefore the cross sections show the islands 110 (e.g. p+) and the shield diffusion 108 with the same depth. It is an advantage to use the same diffusion for the p+ areas 110 and the n-shield 108. It is clear that the shield diffusion should be very shallow at the surface as otherwise the piezo diffusion 104 under the shield diffusion 108 gets too thin. So, for the shield diffusion 108 has a typical thickness of 0.1 to 0.4 µm In another embodiment of the present invention the conductive shield 108 is a polysilicon shield. In order to be compatible with CMOS, in this example this polysilicon shield is not covering the islands 110 and a spacing around the islands. This example is illustrated in FIGS. 4 to 6. FIG. 4 showing the top view, FIG. 5A showing the longitudinal cross-section, FIG. 5B showing the transversal cross-section and FIG. 6 showing a top view of a piezo-resistors based structure on a membrane. In this example the polysilicon layer is present over the p-substrate/piezo diffusion 104 and an insulation layer. It is the first conductive layer. When using standard CMOS process for manufacturing the sensor, it is not allowed to put polysilicon over the silicide of the island 110. Also in this example the islands 110 (p++ areas with silicide) are inside the piezo diffusion region and the outer edge of the piezo-diffusion region 104 is covered by the shield 108. Also in this example a guard ring 102 is present. This guard ring is, however, not strictly necessary but is a further improvement in preventing inversion of the bulk.

In the exemplary embodiments of the present invention illustrated in FIGS. 4 to 6 the conductive shield 308 is constructed on top of the dielectric layer 120 using polysilicon. The conductivity of the polysilicon layer may be enhanced with high doping and even with a metal-silicon alloy. Because of the CMOS design rules, the polysilicon shield cannot overlap the islands 110 (e.g. p++ doped islands). The guard ring 102 is provided to further improve the shielding.

In the embodiments cited above a shielding solution is provided which is not covering the islands 110 (e.g. the p++ doped islands). In case of an n-shield this is done because the islands 110 (p+ doped islands) are not compatible with n-shield due to low breakdown voltage. In case of a CMOS poly shield this is done because the doping of the islands is not compatible with standard CMOS where source drain implants are only done after poly deposition. In these embodiments the piezo diffusion surrounds the islands 110 (e.g. the p++ diffusion).

In these embodiments there is a gap between the islands 110 (e.g. the p++ diffusion) and the shield 108, 308 and the edge of the shield 108, 308 around the islands 110 (e.g. p++ area) is still inside this piezo diffusion 104. The gap between the n-shield 108 and islands 110 (p+ area) prevents breakdown between n-shield 108 and islands 110 (p+ areas) and therefore no breakdown constraint or doping constraint for the n-shield 108 exists which allows high doping of the n-shield diffusion and therefore better shielding. The doping level of the n-shield can be as high or even higher than the islands 110 (the p+ area). In these embodiments the piezo diffusion 104 is present around the islands 110 (e.g. p+ area) and the outer edge of the piezo diffusion is shielded.

Figure 7:
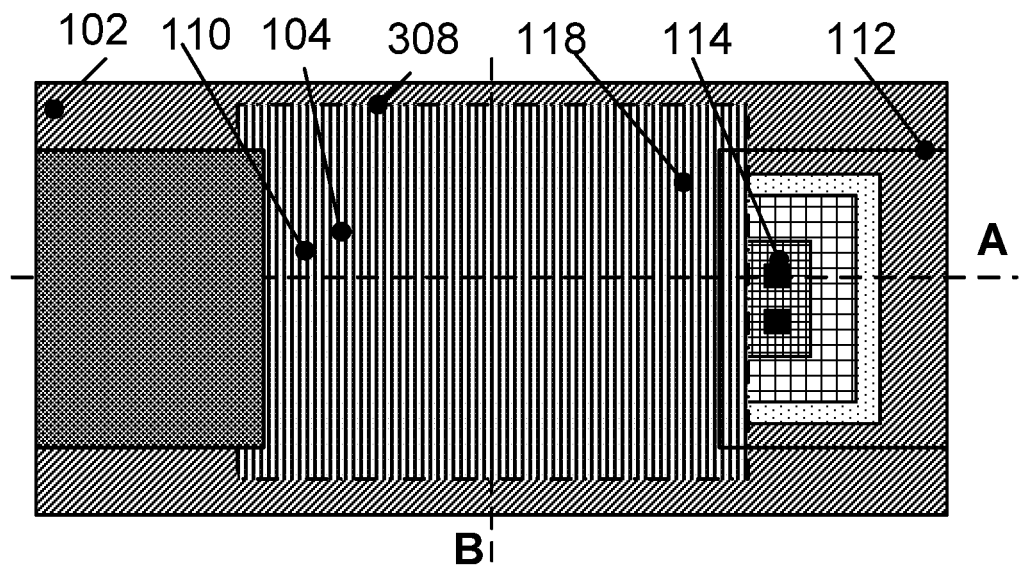
FIG. 7 shows the top view of a piezo-resistor based sensor comprising a non-CMOS poly shield in accordance with embodiments of the present invention.
Figure 8:
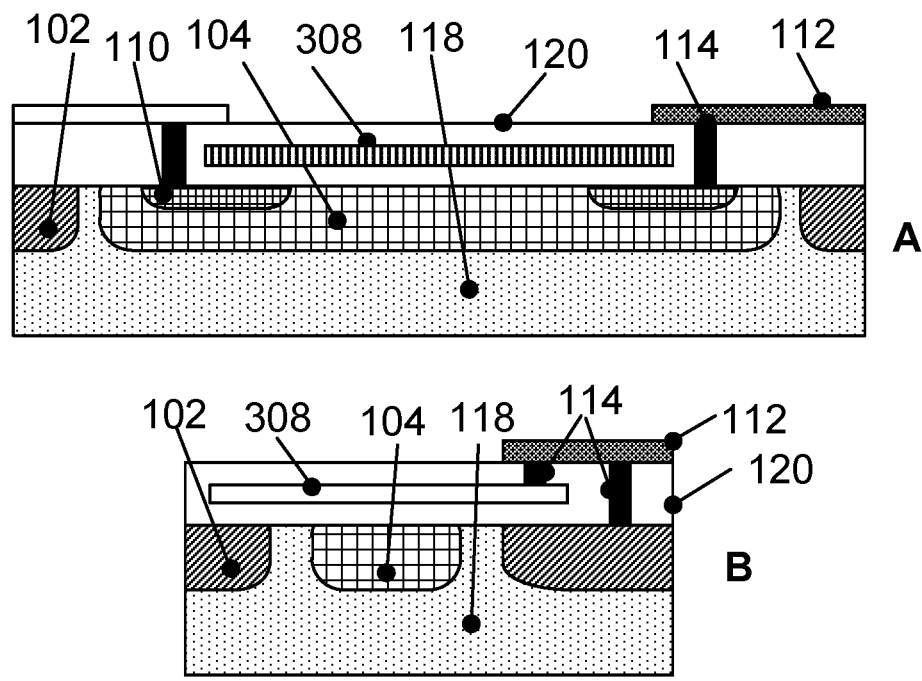
FIG. 8 shows cross-sections of a piezo-resistor based sensor comprising a non-CMOS poly shield in accordance with embodiments of the present invention.
Figure 9:
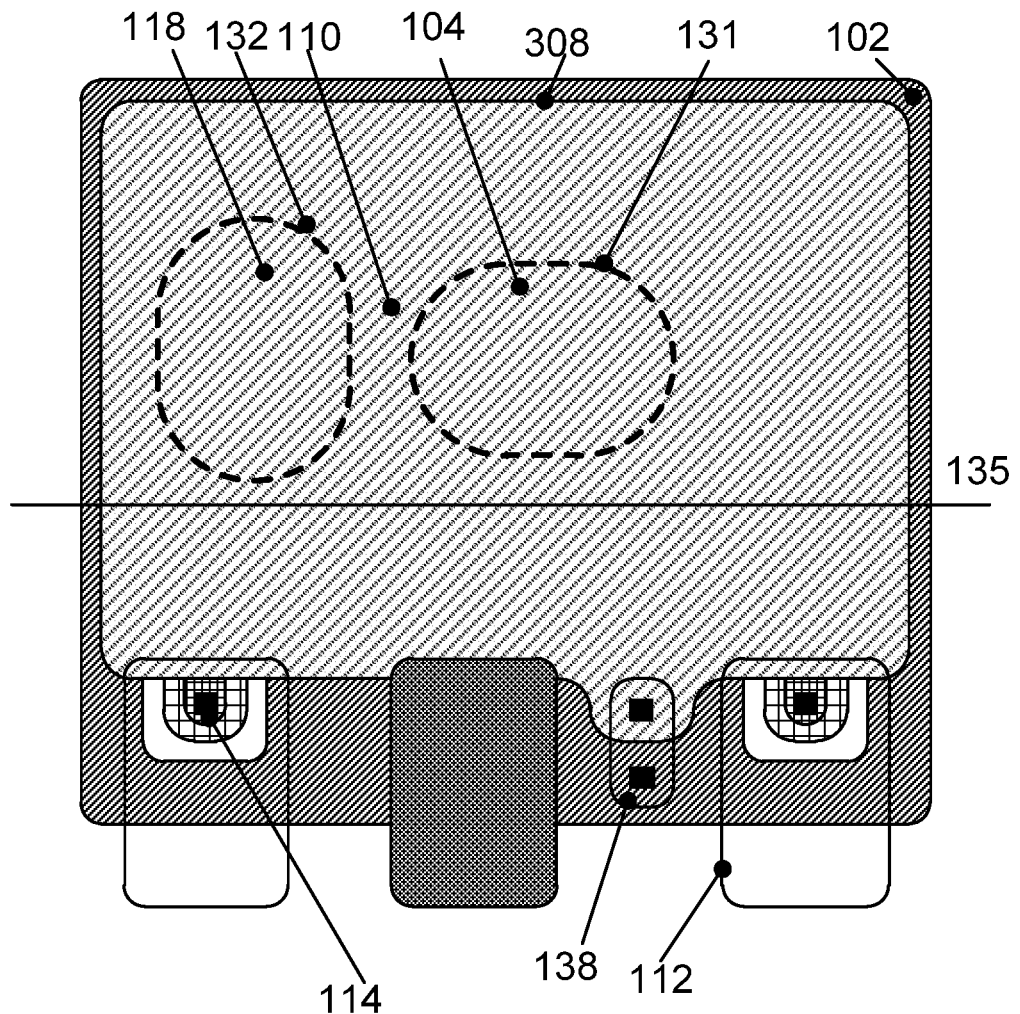
FIG. 9 shows the layout of a double resistor based sensor comprising a non-CMOS poly shield in accordance with embodiments of the present invention.

FIGS. 7 to 9 illustrate another exemplary embodiment of the present invention wherein the conductive shield 108 is a polysilicon shield with guard over the islands 110 (non-CMOS). In such embodiments no silicide is possible for the islands without additional processing steps. In this exemplary embodiment of the present invention an overlap is present between conductive layers such as metal with polyshield. This overlap provides protection for complete inverted bulk by extreme exposure of ions at the surface. In this exemplary embodiment of the present invention all the bulk area adjacent to the diffusion path is covered by one of the two conductive layers (the conductive interconnect structures or the conductive shield). Also in this example the guard ring is not strictly required but improves protection.

In the schematic drawings of FIGS. 7 and 8 the conductive shield 308 is constructed on top of the dielectric layer 120 using e.g. polysilicon. The conductivity of the polysilicon layer may be enhanced with high doping and even with a metal-silicon alloy. In the case shown in the pictures the polysilicon 308 can cover the islands 110 (e.g. p++ areas) when they are not provided with a silicide. Hence, the entire diffusion path 104 is covered with the polysilicon shield 308 except for the contacts to the islands 110. However, here the interconnect structures 112 (e.g. in metal) contacting the diffusion path 104 can provide complete shielding by assuring that the interconnect structure 112 covers the opening in the polysilicon shield 308. FIG. 9 shows the layout of a double resistor with such a polysilicon shield 308 with the longitudinal resistor 132, the transversal resistor 131 and the membrane edge 135. The shield 308 is connected to the guard ring 102 by contact 138.

In some embodiments of the present invention the conductive shield 208 may be formed with the same layer as the conductive interconnect structures 112. In these embodiments the conductive layer is used both for shielding and interconnecting the sensor. In these embodiments the guard ring is required to avoid leakage from one place of a piezo diffusion 104 to another place of that piezo diffusion 104 or another place of another piezo diffusion as by nature the different metal structures need gaps as they have different voltages. In these embodiments the distance of the guard ring 102 to piezo diffusion path 104 should be kept as small as possible, but large enough to prevent breakdown. The distance may for example range between 1 and 5 µm.

Figure 10:
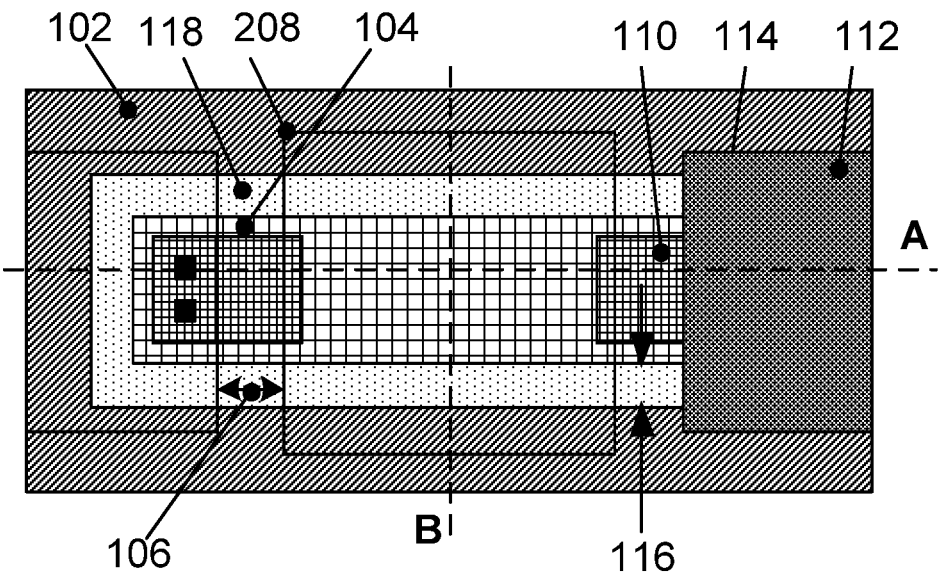
FIG. 10 shows the top view of a piezo-resistor based sensor comprising a single metal shield in accordance with embodiments of the present invention.
Figure 11:
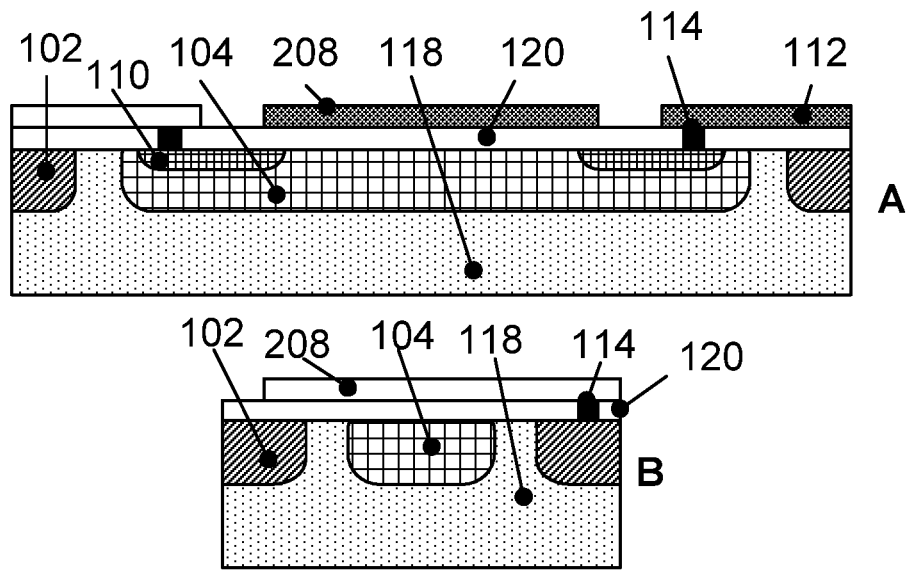
FIG. 11 shows cross-sections of a piezo-resistor based sensor comprising a single metal shield in accordance with embodiments of the present invention.
Figure 12:
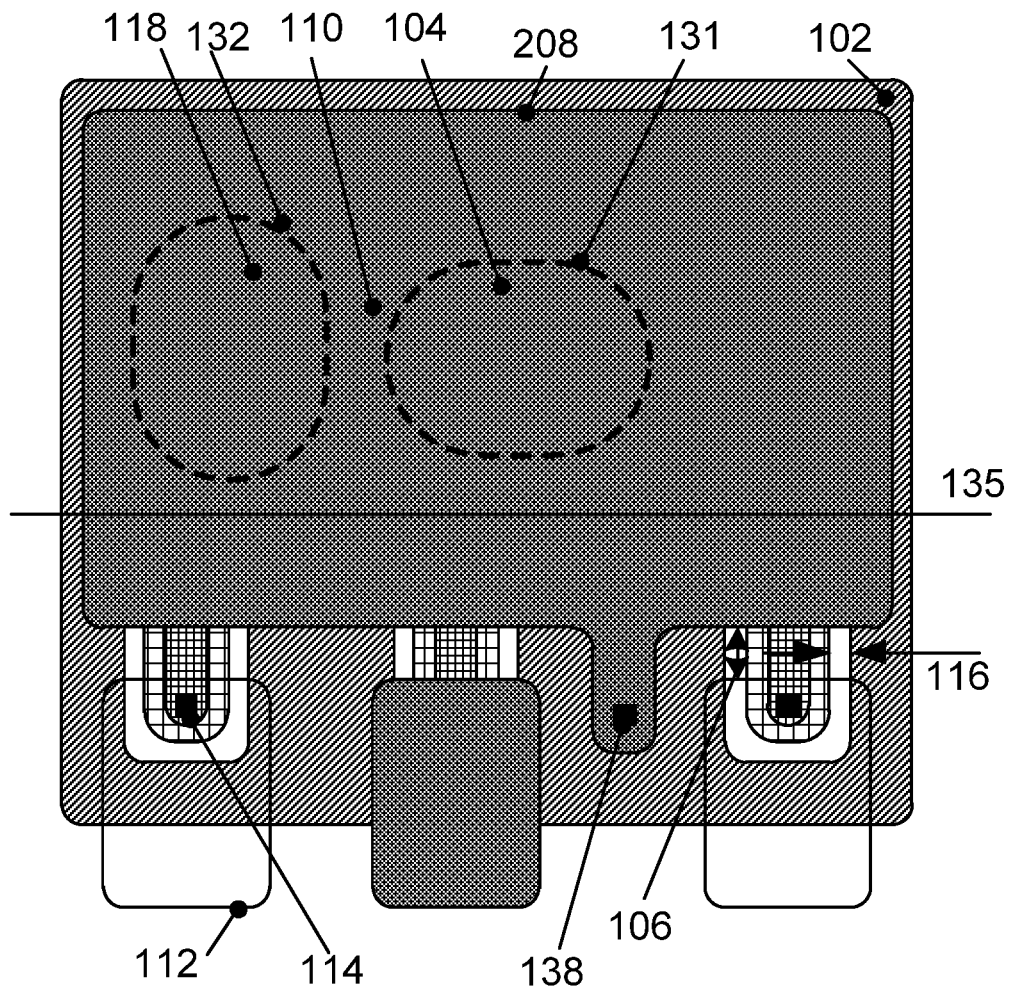
FIG. 12 shows the layout of a double resistor based sensor comprising a single metal shield in accordance with embodiments of the present invention.
Figure 13:
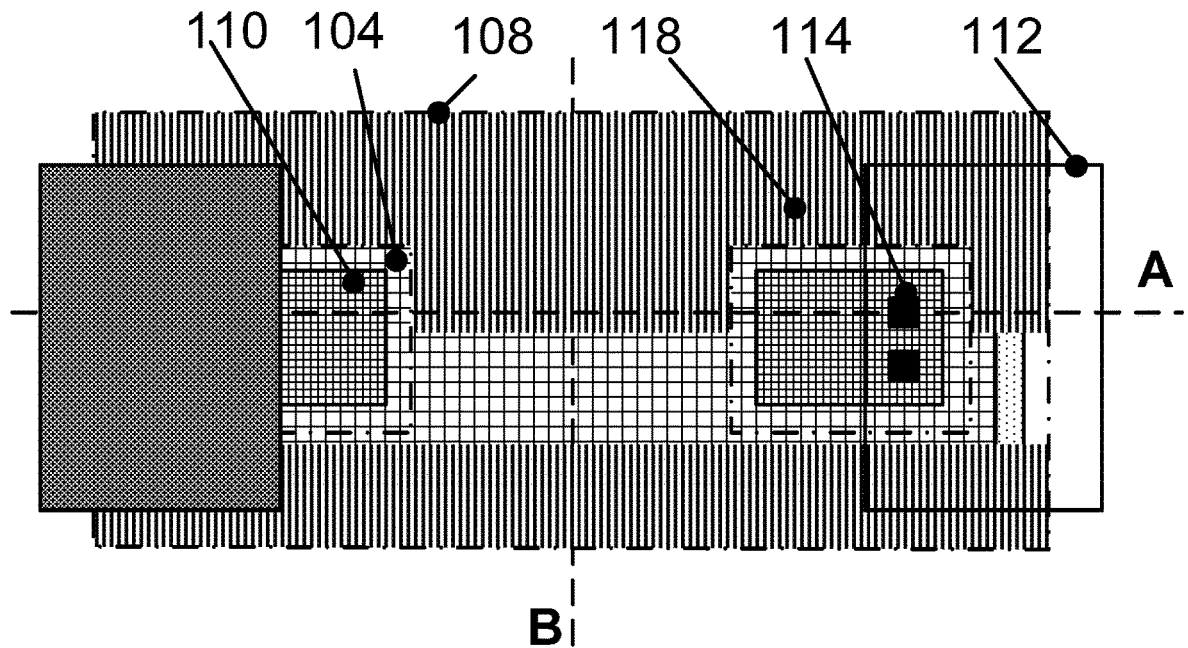
FIG. 13 shows the top view of an alternative piezo-resistor based sensor without guard ring and comprising an n-type conductive shield in accordance with embodiments of the present invention.
Figure 14:
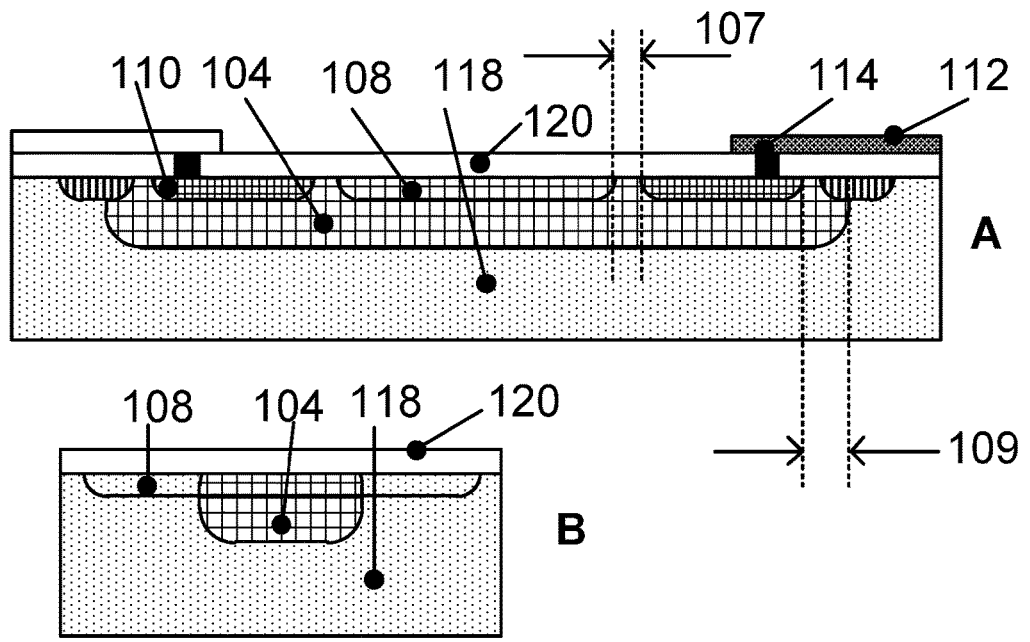
FIG. 14 shows cross-sections of an alternative piezo-resistor based sensor without guard ring and comprising an n-type conductive shield in accordance with embodiments of the present invention.
Figure 15:
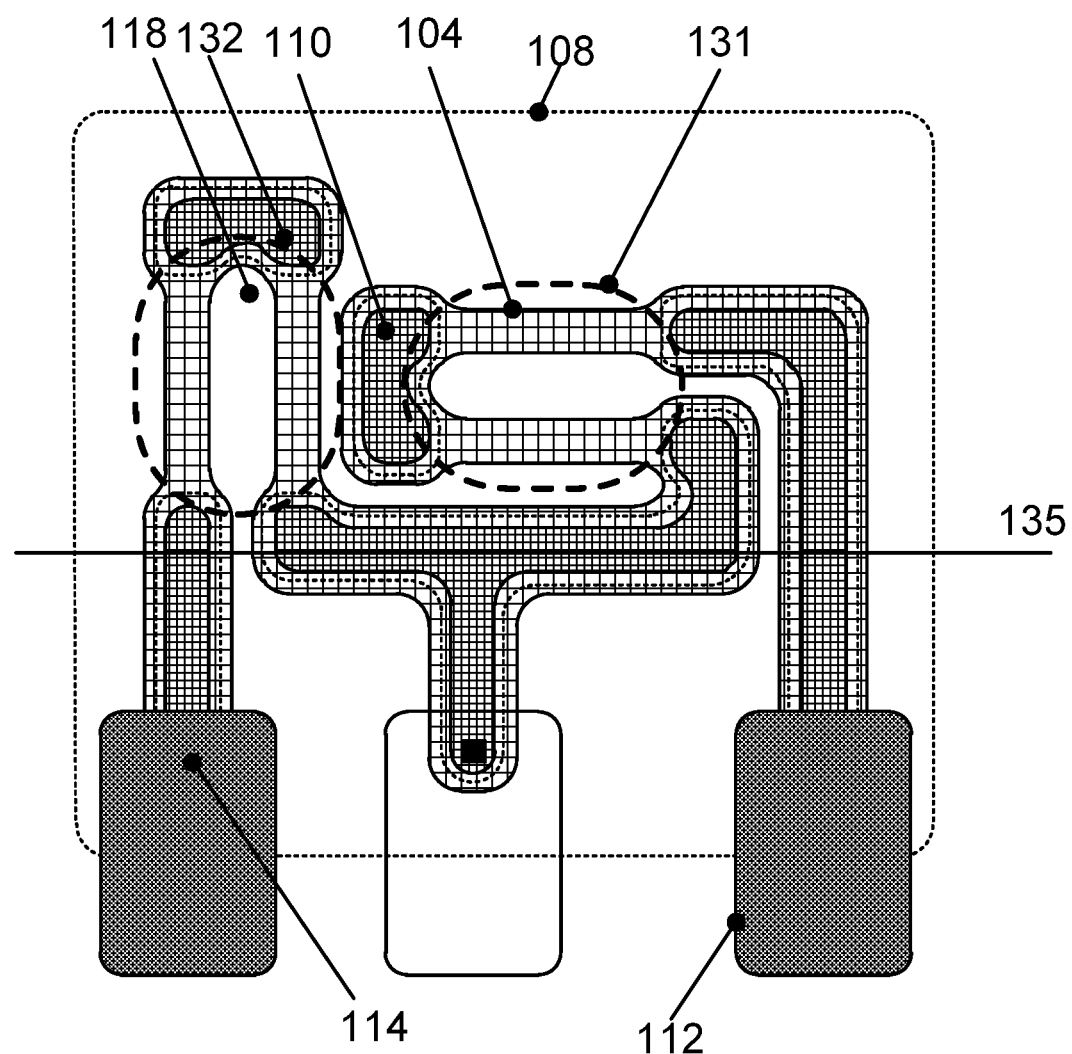
FIG. 15 shows the layout of an alternative double resistor based sensor without guard ring and comprising an n-type conductive shield in accordance with embodiments of the present invention.

In these embodiments the conductive shield 208 is isolated from the conductive interconnect structures 112. Examples thereof are illustrated in FIGS. 10 to 12.

The current through the piezo diffusion region 104 basically runs from one contact 114 on one end of a highly doped region 110 in the piezo diffusion region 104 through the highly doped region towards a low doped region 104 at the other end of the highly doped region. The lowly doped part 104 of the piezo diffusion region is the piezo resistive area designed to change resistance with membrane deformation. Once passed this piezo resistive area, the current runs into one end of another highly doped area 110 and then through this area towards its other end where it leaves this highly doped area through a second contact 114.

In this exemplary embodiment of the present invention a guard ring 102 of the second conductivity type is formed around the entire piezo-diffusion region 104. Preferably the shield 208 bridges everywhere the gap between the piezo-diffusion region 104 and the guard ring 102. However, the conductive shield 208 above the piezo resistive area 104 has a different bias than the interconnect structures 112 at the contacts 114. Also the biases at these contacts 114 are different. For some applications, especially where the interconnect 112 is not covered with passivation, it is necessary to leave a gap 106 of more than 10, 20 or even 50 µm between the metal structures to avoid surface leakage currents between the metal structures. Between these gaps 106 the influence of external electric fields must be kept as small as possible.

Modulation of the piezo diffusion 104 can be prevented by placing a highly doped island 110 that starts under the conductive interconnect structure 112 (e.g. metal structure) providing a contact that runs from the metal contacting the piezo diffusion 104 to run towards and then under the conductive shield 208 (e.g. metal structure) that is serving as shield for the piezo resistive area 104.

The voltage drop between the contact holes 114 to the edge of the metal structure 112 covering the contact is small as the highly doped region 110 has a much smaller resistance than the low doped piezoresistive area 104. Therefore one can say that the metal 112 providing the contact and covering the gap between the piezo resistive area 104 and the guard ring 102 around that contact is basically at the same voltage as the piezo resistive area 104 under that metal. One can say that the voltage difference between the metal contacting the piezo diffusion region 104 and covering the gap towards the guard ring 102 is less than 10% or even less than 5% or even less than 10% of the voltage across the piezo resistor.

Leakage from the piezo diffusion region 104 can only take place from the diffusion region that is not covered by the shield 208, 112. So, where the gap between the metal structures 208, 112 is present. Therefore the guard ring 102 has to run also from under the edge of one metal structure (the conductive interconnect structure 112) to under the edge of another metal structure (the conductive shield 208). Between the guard ring 102 and the piezo diffusion region 104 leakage currents can still flow, but can be reduced by keeping the gap between the guard ring and piezo diffusion region as small as possible. The current caused by inversion in these narrow spaces between guard and piezo diffusion region can then be neglected in comparison with the current through the highly doped area running parallel to this narrow space. The leakage currents can be reduced by reducing the gaps sizes and by reducing the resistance of the highly doped areas.

In the following paragraphs the embodiments illustrated in FIGS. 10 and 11 are discussed in more detail. In these embodiments the conductive shield 208 is constructed on top of the dielectric layer 120 using the same layer as is used for the conductive interconnect structure 110. Now gaps 106 are needed between the metal structures 112, 208 as the conductive shield 208 is normally contacted to the substrate whereas the resistor connections (the interconnect structures 112) are connected to another node with another voltage. The metal cannot provide shielding in the gaps, but one can assure that these gaps are bridged with highly doped areas 110 that are hardly modulated by external electrical fields and that the guard-ring 102 keeps the areas that can invert as small as possible. The gap 106 between the metal structures is a compromise between effective shielding and the risk of surface conduction between the metal structures. Inversion of the non-covered areas between the shield 208 and guard ring 102 will not lead to leakage currents as the guard ring 102 blocks this current to flow away from the diffusion path 104. FIG. 12 shows the layout of a double resistor with such a metal shield 208 with a longitudinal resistor 132, a transversal resistor 131, a membrane edge 131, and the gap 106 between the metal structures (the conductive shield 208 and the conductive interconnect structures 112). The shield 208 is connected to the guard ring 102 by contact 138.

The diffusions are typically made with the combination of an ion implant followed by a high temperature diffusion step. Depending on the amount of ions per cm$^2$ one implants, one can obtain sheet resistivities varying from about 25 ohm/square to 5000 ohm/square. Typical doping ions are boron (p-type dopant), phosphorous (n-type dopant) and arsene (n-type dopant). In addition one can add a so called silicide step where one deposits a metal such as Ti, Pt, Ni, or Co directly onto a doped area followed by a high temperature anneal step where the metal starts mixing with the silicon. Metal that did not diffuse into the silicon is normally etched with a selective etch which etches the deposited metal but not the created silicide. Such silicide steps are generally used to improve the electrical contact between metals and silicon. With the addition of silicide the sheet resistance is further reduced to only a few ohm/square, The guard ring 102 may be manufactured in a similar way as substrate contact areas by using the same ion implantation and anneal as is used for the substrate contact areas. The guard ring may contain a metal-silicon alloy 122 by using the same silicide process as is used for the enhancement of the silicon-metal contacts. Typically the dopant concentration for the guard ring 102 and substrate contacts 114 are similar or higher than that of the islands 110 (e.g. p++ areas) with sheet resistances which may be varying from 20 to 200 ohm/square without silicide and from 1 to 5 ohm/square when a silicide covers the diffusion. It is an advantage of embodiments of the present invention that the substrate contact and the guard ring can be realized simultaneously.

The invention claimed is:

1. A piezo-resistor based sensor comprising at least one sensing element provided on a flexible structure, the sensing element comprising:
   at least one piezo-diffusion region of a first conductivity type in a well of a second conductivity type different from the first conductivity type;
   two or more contacts in electrical contact with islands in the piezo-diffusion region, the piezo-diffusion region extending between the two or more contacts, wherein the islands have a higher doping of the first conductivity type than the doping of the piezo-diffusion region;
   a conductive interconnect structure per contact for electrically biasing the piezo-diffusion region through the contacts;
   wherein a conductive shield is covering the piezo-diffusion region between the contacts and extends over side walls of the piezo-diffusion region between the contacts and wherein each conductive interconnect structure is covering the piezo-diffusion region at the corresponding contact and extends over edges of the piezo-diffusion region at the corresponding contact and wherein each island is at one side covered by its corresponding conductive interconnect structure;
   wherein the sensing element comprises a guard ring of the second conductivity type around the piezo diffusion region with a distance between the guard ring and the piezo diffusion region, wherein the conductive shield is covering the well between the piezo diffusion region and the guard ring, and the edge of the guard ring facing the piezo diffusion region and wherein, if a gap is present between the conductive shield and the interconnect structure, the guard ring bridges this gap; and/or
   wherein the edges of the piezo-diffusion region are completely covered by the combination of the conductive shield and the interconnect structures.

2. The piezo-resistor based sensor according to claim 1, wherein the distance between the guard ring and the piezo-diffusion region is smaller than 5 µm.

3. The piezo-resistor based sensor according to claim 1, wherein the conductive shield is electrically connected to the guard ring.

4. The piezo-resistor based sensor according to claim 1, wherein the conductive shield consists of the same material as the conductive interconnect structures, and wherein conductive shield is isolated from the conductive interconnect structures.

5. The piezo-resistor based sensor according to claim 4, wherein the conductive shield is separated from the conductive interconnect structures by a gap of at least 10 µm.

6. The piezo-resistor based sensor according to claim 4, wherein each island stretches from its corresponding conductive interconnect structure to the conductive shield such that at least part of it is covered by the conductive shield.

7. The piezo-resistor based sensor according to claim 1, wherein the conductive interconnect structures cover part of the well between the guard ring and the piezo-diffusion region.

8. The piezo-resistor based sensor according to claim 1, wherein the conductive shield consists of a material which is different from the material of the conductive interconnect structures.

9. The piezo-resistor based sensor according to claim 8, wherein the conductive shield covers the piezo-diffusion region except for the islands.

10. The piezo-resistor based sensor according to claim 8, wherein the conductive shield covers the piezo-diffusion region except for the islands and a spacing around the islands.

11. The piezo-resistor based sensor according to claim 8, wherein the conductive shield covers the entire well between the piezo-diffusion region, and covers the edge of the guard ring facing the piezo-diffusion region.

12. The piezo-resistor based sensor according to claim 8, wherein the conductive shield comprises a shallow diffusion of the second conductivity type.

13. The piezo-resistor based sensor according to claim 8, wherein the conductive shield is made of polysilicon.

* * * * *